United States Patent
Duan et al.

(10) Patent No.: US 8,338,705 B2
(45) Date of Patent: Dec. 25, 2012

(54) GROUNDING MECHANISM FOR SLIDE-TYPE ELECTRONIC DEVICES

(75) Inventors: Chao Duan, Shenzhen (CN); Chia-Hua Chen, Taipei (TW)

(73) Assignees: Shenzhen Futaihong Precision Industry Co., Ltd., Shenzhen (CN); FIH (Hong Kong) Limited, Kowloon (HK)

( * ) Notice: Subject to any disclaimer, the term of this patent is extended or adjusted under 35 U.S.C. 154(b) by 269 days.

(21) Appl. No.: 12/844,978

(22) Filed: Jul. 28, 2010

(65) Prior Publication Data

US 2011/0266019 A1 Nov. 3, 2011

(30) Foreign Application Priority Data

Apr. 28, 2010 (CN) .......................... 2010 1 0158344

(51) Int. Cl.
*H05K 5/02* (2006.01)
*H05K 5/00* (2006.01)
*H01H 9/02* (2006.01)

(52) U.S. Cl. ......... 174/51; 174/53; 174/54; 361/679.01; 361/679.02; 361/679.03; 361/679.04

(58) Field of Classification Search ............. 361/679.01, 361/679.02, 679.08, 679.09, 679.3, 679.55–679.59, 361/756–759; 174/535, 51–55
See application file for complete search history.

(56) References Cited

U.S. PATENT DOCUMENTS

| | | | |
|---|---|---|---|
| 2008/0045056 A1* | 2/2008 | Collantes, et al. | 439/131 |
| 2010/0258639 A1* | 10/2010 | Florek et al. | 235/492 |
| 2010/0291810 A1* | 11/2010 | Tsao | 439/816 |
| 2011/0273828 A1* | 11/2011 | Cochrane | 361/679.02 |

* cited by examiner

*Primary Examiner* — Jayprakash N Gandhi
*Assistant Examiner* — Jerry Wu
(74) *Attorney, Agent, or Firm* — Altis Law Group, Inc.

(57) ABSTRACT

A grounding mechanism is used for a slidable electronic device including a first housing and a second housing. The grounding mechanism includes a grounding tab and a protrusion. The grounding tab is for attachment to the first housing, and defines a depression coated with a conductive layer. The protrusion is formed in the second housing. When the protrusion is received in the recess, the protrusion abuts against the conductive layer for electronically connecting the first housing to the second housing.

4 Claims, 6 Drawing Sheets

GROUNDING MECHANISM FOR SLIDE-TYPE ELECTRONIC DEVICES

CROSS-REFERENCE TO RELATED APPLICATION

This application is related to co-pending U.S. patent application Ser. Nos. 12/844,975 and 12/844,982, entitled "GROUNDING MECHANISM FOR SLIDE-TYPE ELECTRONIC DEVICES", by Duan et al., which have the same assignee as the present application. The above-identified application is incorporated herein by reference.

BACKGROUND

1. Technical Field

The disclosure relates to grounding mechanisms and, particularly, to a grounding mechanism used in a slide-type electronic device.

2. Description of Related Art

Slide-type electronic devices have multiple housing elements, such as two housing elements, of which one typically slides over the other to open/close the electronic device. Electromagnetic interference and electrostatic charges are easily produced in the two housings when in use. However, it is difficult to maintain a good ground because of wear and tear over time from the two housing elements repeatedly moving relative to each other which wears the plating on the grounding contact.

Therefore, there is room for improvement within the art.

BRIEF DESCRIPTION OF THE DRAWINGS

Many aspects of the grounding mechanism can be better understood with reference to the following drawings. The components in the drawings are not necessarily drawn to scale, the emphasis instead being placed upon clearly illustrating the principles of the present grounding mechanism. Moreover, in the drawings, like reference numerals designate corresponding parts throughout the several views.

DETAILED DESCRIPTION

The present grounding mechanism may be applied in many different slide-type electronic devices such as mobile phones, game devices, PDAs (personal digital assistant) and others. In an illustrated embodiment, the grounding mechanism is used in a slide-type mobile phone.

Figure 1:
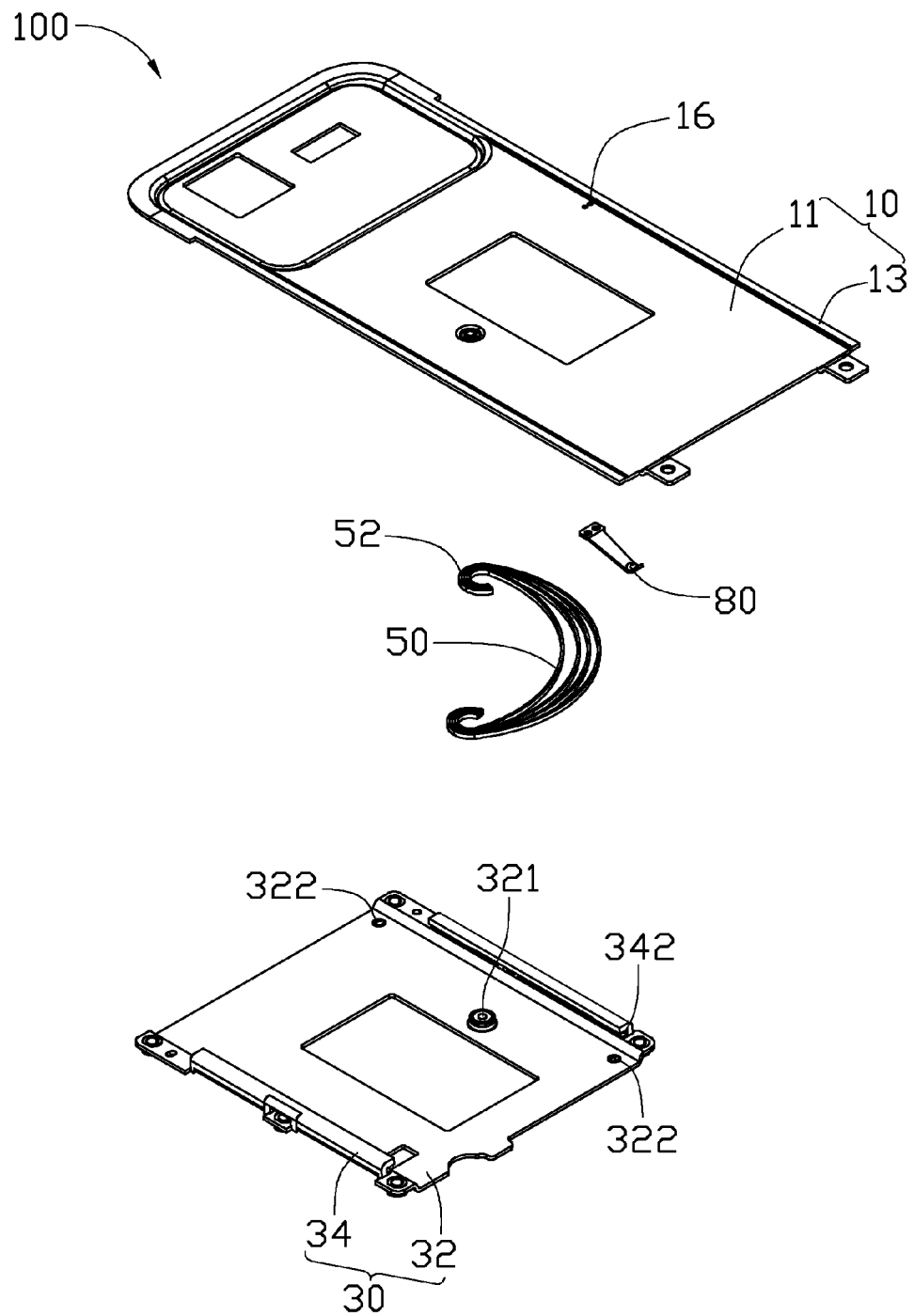
FIG. 1 is an exploded, isometric view of several portions of an electronic device using a grounding mechanism in accordance with an exemplary embodiment.
Figure 2:
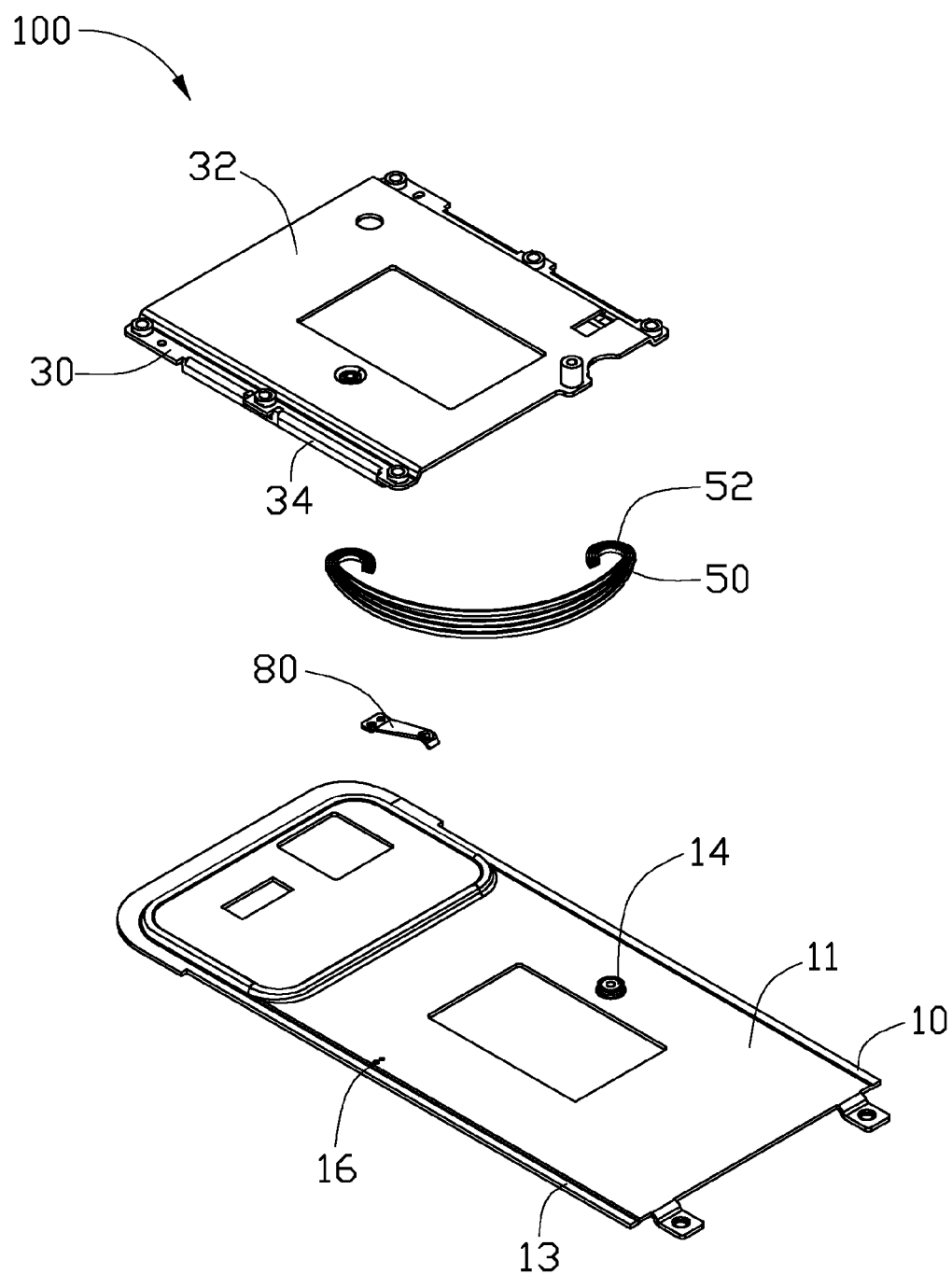
FIG. 2 is similar to FIG. 1, but shown from another aspect.

Referring to FIGS. 1 and 2, the electronic device 100 includes a first housing 10, a second housing 30, an elastic member 50 and a grounding tab 80. The elastic member 50 can drive the first housing 10 to slide relative to the second housing 30. The grounding tab 80 can conduct electromagnetic charges from the first housing 10 and the second housing 30 to a ground pin of a printed circuit board (not shown) of the mobile phone 100.

The first housing 10 may be a cover of the electronic device 100. The first housing 10 includes a recessed portion 11 and two rail portions 13 extending from two opposite edge ends of the recessed portion 11. A first post 14 is formed on one surface 12 of the recessed portion 11. Two through holes 16 are defined in the surface 12.

The second housing 30 is not as long as the first housing 10. The second housing 30 includes a main plate 32 and two sliding portions 34 at two opposite borders of the main plate 32. The two sliding portions 34 are generally U-shaped bars, and each defines a groove 342 corresponding to one of the two rail portions 13. The rail portions 13 can slide in the grooves 342. A second post 321 is formed on the main plate 32. Two protrusions 322 protrude from the main plate 32 adjacent to one (i.e., the same) slide portion 34. Each protrusion 322 may be substantially hemispherical and integrally formed with the second housing 30.

The elastic member 50 is made of a plurality of leaf springs, and includes a connecting portion 52 at two ends. The connecting portions 52 are configured to be respectively secured to the first housing 10 and the second housing 30. The elastic member 50 is designed to provide a predetermined torsion to drive the first housing 10 to slide relative to the second housing 30 in two predetermined positions.

Figure 3:
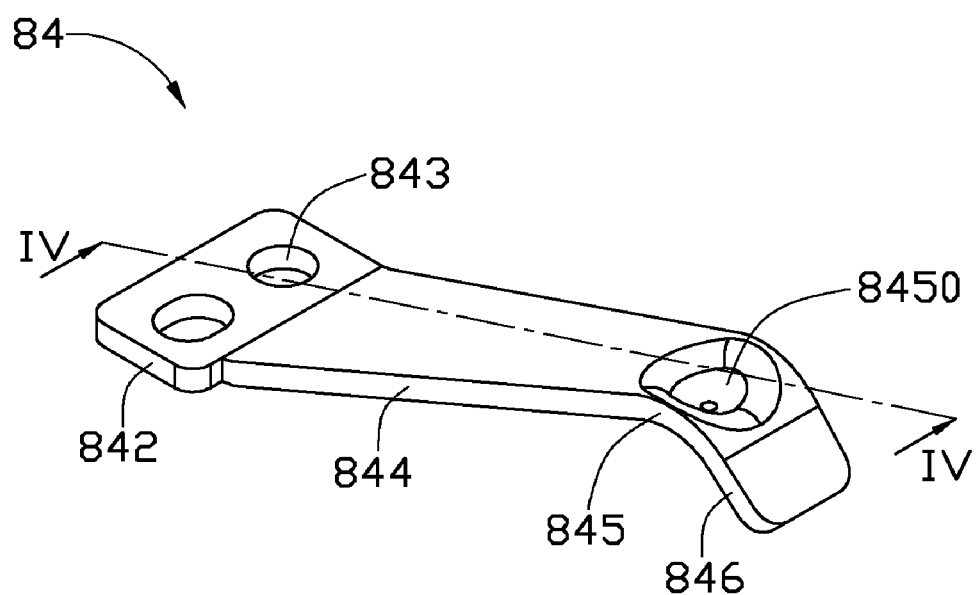
FIG. 3 is an enlarged view of the grounding sheet.
Figure 4:
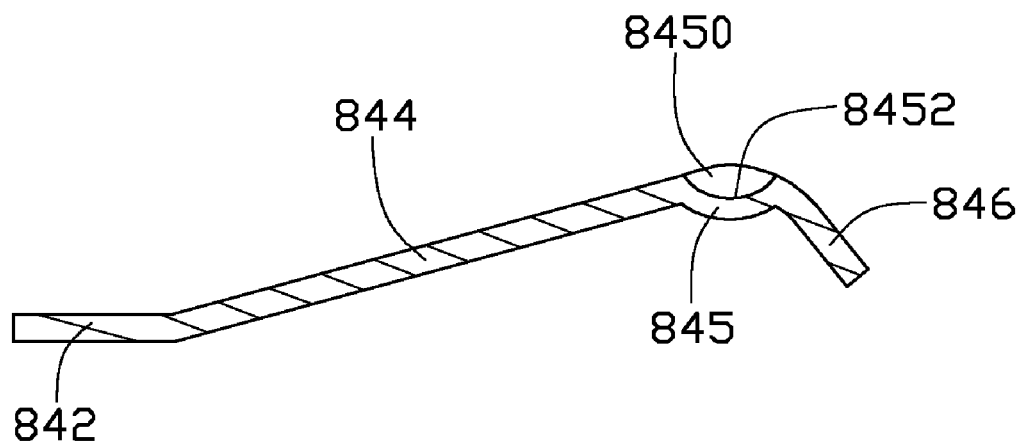
FIG. 4 is a cross-sectional view of FIG. 3 along line IV-IV thereof.

Referring to FIGS. 3 and 4, the grounding tab 80 is made of metal, and may be stamped or punched from a metal sheet. The grounding tab 80 includes a seat portion 842, an angled portion 844, an arcuate portion 845 and an extending portion 846. The seat portion 842 defines two fastener holes 843 corresponding to the through holes 16 for mounting the grounding tab 80 to the first housing 10 with fasteners, such as screws/bolts. Alternatively, the seat portion 842 may be fixed to the first housing 10 by way of, for example, welding. The angled portion 844 extends from one end of the seat portion 842. The arcuate portion 845 is connected between the angled portion 844 and the extending portion 846. The arcuate portion 845 defines a depression 8450 for receiving one of the protrusions 322. A conductive layer 8452 is coated on an inside wall of the depression 8450. In this exemplary embodiment, the conductive layer 8452 is a metallic layer made of gold. The gold layer is about 20-250 nm thick depending on cost considerations and wear resistant quality desired and or needed. When the grounding tab 80 is slid relative to the second housing 30 to a closed state or an open state, one of each of the two protrusions 322 are alternatively received in the depression 8450. The protrusions 322 abut against the conductive layer 8452 to electronically connect the second housing 30 to the first housing 10.

Figure 5:
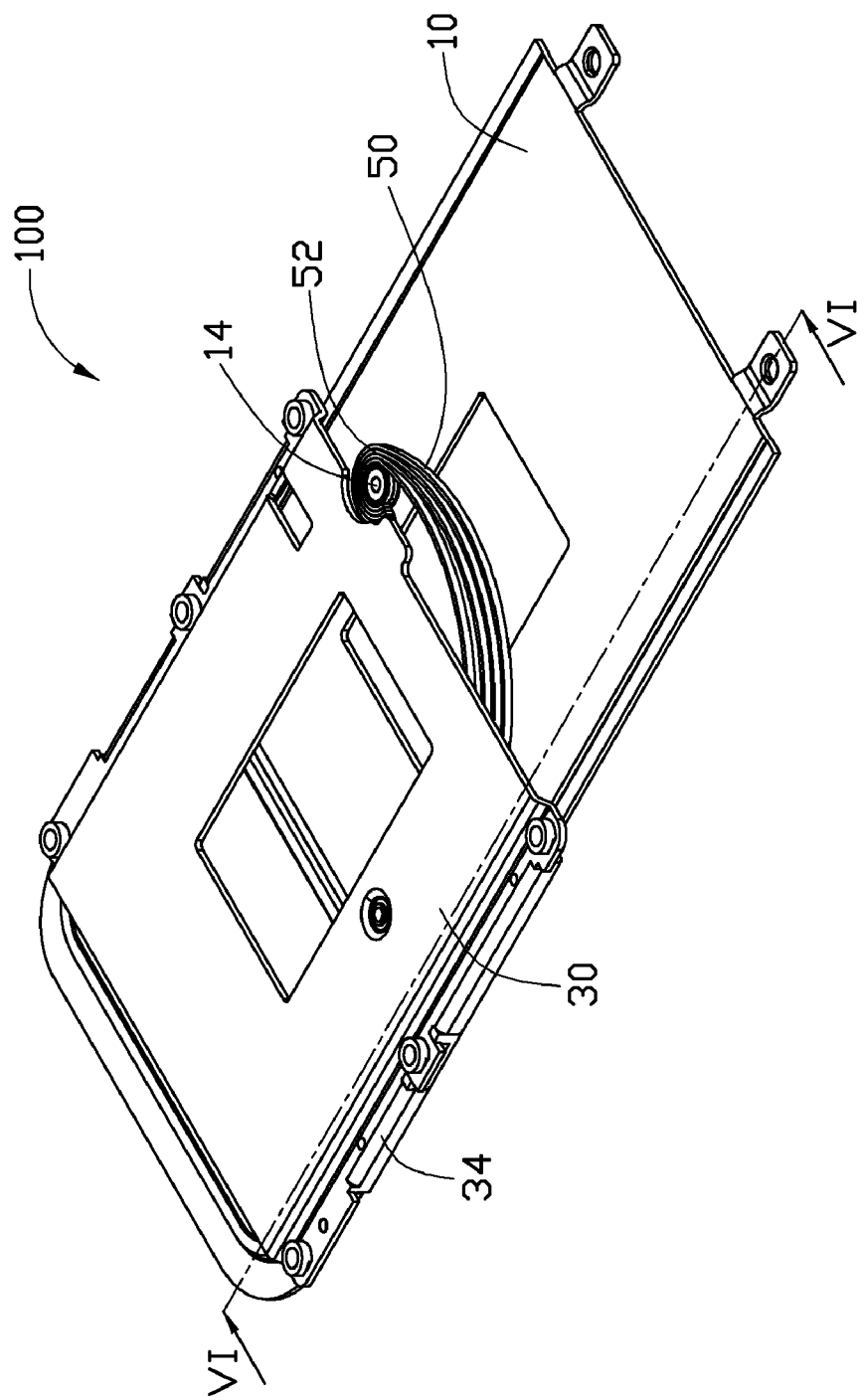
FIG. 5 is an assembled, schematic view of the electronic device.
Figure 6:
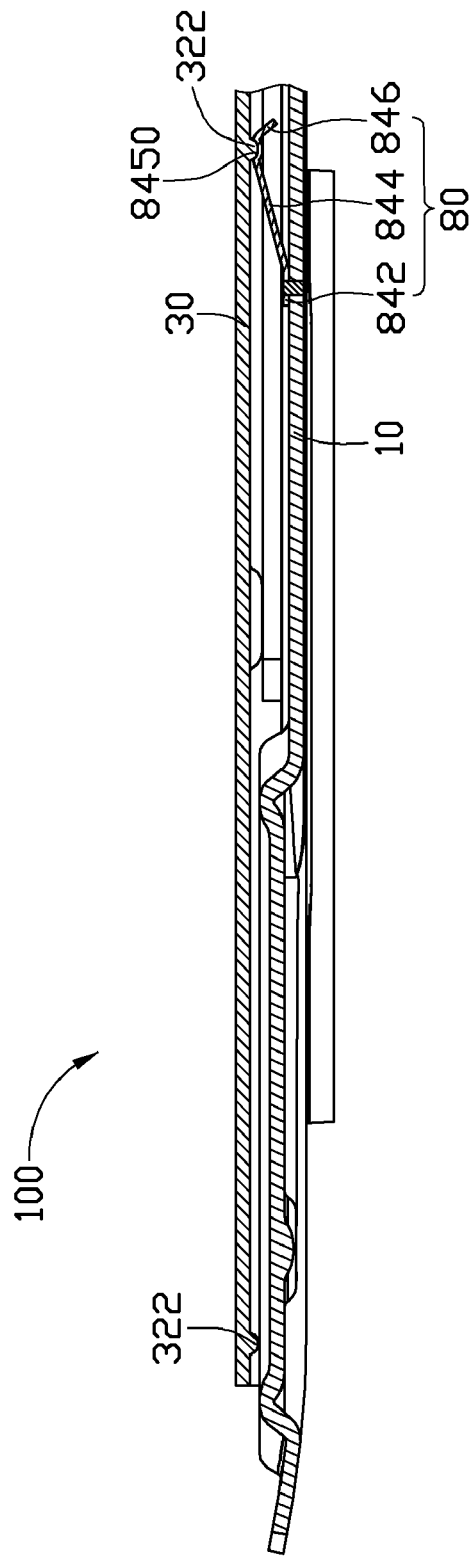
FIG. 6 is a cross-sectional view of FIG. 5 along VI-VI line thereof.

Referring to FIGS. 5 to 6, to assemble the electronic device 100, the connecting portions 52 are respectively secured to the first post 14 of the first housing 10 and the second post 36 of the second housing 30. The rail portions 13 are received in and can linearly slide within the slide grooves 342. The second housing 30 is slidably attached to the first housing 10. One of the protrusions 322 is received in the depression 8450, and abuts against the conductive layer 8452 to electronically connect the second housing 30 to the first housing 10. Thus, the portable electronic device 100 is at an open state.

When the electronic device 100 is to be driven from the opened position to the closed position, the second housing 30 slides relative to the first housing 10. The arcuate portion 845 of the grounding tab 80 slides on the second housing 30 until the other protrusions 322 is received in the depression 8450. Therefore, the first housing 10, the conductive layer 326, the grounding tab 80, and the second housing 30 are electronically connected to a grounding pin of a main circuit board.

A significant advantage of the grounding mechanism is that the grounding tab is easily assembled to the first housing. This simplifies assembly of the electronic device so that costs are reduced. In addition, this structure may greatly increase the conductive ability.

It is to be understood, however, that even though numerous characteristics and advantages of the present disclosure have been set forth in the foregoing description, together with details of assembly and function, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. An electronic device comprising:
   a first housing;
   a grounding tab for attachment to the first housing, the grounding tab including an angled portion, an arcuate portion and an extending portion, the arcuate portion being connected between the angled portion and the extending portion, the arcuate portion defining a depression with an inside wall and a brim, a conductive layer coated on the inside wall of the depression;
   a second housing slidably attached to the first housing, and including two protrusions formed thereon, the angled portion and the extending portion of the grounding tab spaced from the second housing;
   wherein when the second housing is at a closed state relative to the first housing, one of the protrusions is received in the depression, and abuts against the conductive layer in the depression for electronically connecting the first housing to the second housing;
   when the second housing slides relative to the first housing from the closed state toward an open state, the brim of the arcuate portion of the grounding tab slides on the second housing and is spaced apart from the protrusions, preventing an electronic connection between the first housing and to the second housing;
   when the second housing slides to the open state relative to the first housing, the other of the protrusions is received in the depression, and abuts against the conductive layer in the depression for electronically connecting the first housing to the second housing.

2. The electronic device as claimed in claim 1, wherein the conductive layer is a gold layer about 20-250 nm thick.

3. The electronic device as claimed in claim 1, wherein each protrusion is substantially hemispherical.

4. The electronic device as claimed in claim 1, wherein the grounding tab includes a seat portion extending from one end of the angled portion, the seat portion defines two fastener holes for mounting the grounding tab to the first housing with fasteners.

* * * * *